(12) United States Patent
Pendse et al.

(10) Patent No.: US 8,304,919 B2
(45) Date of Patent: Nov. 6, 2012

(54) INTEGRATED CIRCUIT SYSTEM WITH STRESS REDISTRIBUTION LAYER AND METHOD OF MANUFACTURE THEREOF

(75) Inventors: Rajendra D. Pendse, Fremont, CA (US); Chien Ouyang, Pleasanton, CA (US); Mukul Joshi, Mountain View, CA (US)

(73) Assignee: Stats Chippac Ltd., Singapore (SG)

( * ) Notice: Subject to any disclaimer, the term of this patent is extended or adjusted under 35 U.S.C. 154(b) by 224 days.

(21) Appl. No.: 12/748,335

(22) Filed: Mar. 26, 2010

(65) Prior Publication Data
US 2011/0233763 A1    Sep. 29, 2011

(51) Int. Cl.
*H01L 23/52* (2006.01)
*H01L 23/48* (2006.01)
*H01L 29/40* (2006.01)

(52) U.S. Cl. ............... 257/781; 257/E21.589; 257/778; 257/780; 438/108; 438/614

(58) Field of Classification Search ........... 257/E21.589, 257/E23.068, 737, 738, 734, 751, 758, 784, 257/780, 781, 786, 773, 772, 778; 438/106, 438/108, 624, 612–614
See application file for complete search history.

(56) References Cited

U.S. PATENT DOCUMENTS

| | | | |
|---|---|---|---|
| 6,577,012 B1 * | 6/2003 | Greenwood et al. | 257/766 |
| 6,596,619 B1 | 7/2003 | Wang et al. | |
| 6,681,982 B2 | 1/2004 | Tung | |
| 6,784,087 B2 | 8/2004 | Lee et al. | |
| 6,884,661 B1 | 4/2005 | Morris et al. | |
| 7,242,099 B2 * | 7/2007 | Lin et al. | 257/778 |
| 7,397,121 B2 * | 7/2008 | Chou et al. | 257/737 |
| 7,452,803 B2 * | 11/2008 | Lin et al. | 438/624 |
| 7,855,461 B2 * | 12/2010 | Kuo et al. | 257/780 |
| 7,863,721 B2 * | 1/2011 | Suthiwongsunthorn et al. | 257/686 |
| 7,969,006 B2 * | 6/2011 | Lin et al. | 257/758 |
| 8,021,918 B2 * | 9/2011 | Lin et al. | 438/106 |
| 8,022,552 B2 * | 9/2011 | Lin et al. | 257/773 |
| 2006/0091536 A1 | 5/2006 | Huang et al. | |
| 2008/0088013 A1 | 4/2008 | Chew et al. | |

OTHER PUBLICATIONS

Seung Wook Yoon, Serene Meei Ling Thew, Samuel Yak Long Lim, Wai Tin Hnin, Tai Chong Chai, Akella G. K. Viswanath, and Vaidyanathan Kripesh, "150-μm Pitch Cu/Low-k Flip Chip Packaging With Polymer Encapsulated Dicing Line (PEDL) and Cu Column Interconnects" IEEE Transactions on Advanced packaging, Feb. 2008, pp. 58-64, vol. 31, No. 1.

* cited by examiner

*Primary Examiner* — Chris Chu
(74) *Attorney, Agent, or Firm* — Ishimaru & Associates LLP; Mikio Ishimaru; Stanley M. Chang

(57) ABSTRACT

A method of manufacture of an integrated circuit system includes: providing a substrate having a transistor and a metallization layer; forming a metal pad in direct contact with the metallization layer of the substrate; forming a passivation layer in direct contact with the metal pad and covering the substrate; forming a routing trace above the passivation layer in direct contact with the metal pad, and the routing trace is substantially larger than the metal pad, and the routing trace is not electrically insulated by a subsequent layer; and forming a bump connected to the metal pad with the routing trace.

20 Claims, 7 Drawing Sheets

INTEGRATED CIRCUIT SYSTEM WITH STRESS REDISTRIBUTION LAYER AND METHOD OF MANUFACTURE THEREOF

TECHNICAL FIELD

The present invention relates generally to an integrated circuit system, and more particularly to a system for utilizing a stress redistribution layer in an integrated circuit system.

BACKGROUND

The rapidly growing market for portable electronics devices, e.g. cellular phones, laptop computers, and PDAs, is an integral facet of modern life. The multitude of portable devices represents one of the largest potential market opportunities for next generation integrated circuit systems. These devices have unique attributes that have significant impacts on manufacturing integration, in that they must be generally small, lightweight, and rich in functionality and they must be produced in high volumes at relatively low cost.

As an extension of the semiconductor industry, the electronics industry has witnessed ever-increasing commercial competitive pressures, along with growing consumer expectations and the diminishing opportunities for meaningful product differentiation in the marketplace.

Integrated Circuits, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics to precision, ultra miniature form factors, which require automation in order to achieve acceptable yield. These challenges demand not only automation of manufacturing, but also the automation of data flow and information to the production manager and customer.

There have been many approaches to addressing the advanced requirements of microprocessors and portable electronics with successive generations of semiconductors. Many industry road maps have identified significant gaps between the current semiconductor capability and the available supporting electronic technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a substrate having a transistor and a metallization layer; forming a metal pad in direct contact with the metallization layer of the substrate; forming a passivation layer in direct contact with the metal pad and covering the substrate; forming a routing trace above the passivation layer in direct contact with the metal pad, and the routing trace is substantially larger than the metal pad, and the routing trace is not electrically insulated by a subsequent layer; and forming a bump connected to the metal pad with the routing trace.

The present invention provides an integrated circuit system, including: a substrate having a transistor and a metallization layer; a metal pad in direct contact with the metallization layer of the substrate; a passivation layer in direct contact with the metal pad and covering the substrate; a routing trace above the passivation layer in direct contact with the metal pad, and the routing trace is substantially larger than the metal pad, and the routing trace is not electrically insulated by a subsequent layer; and a bump connected to the metal pad with the routing trace.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
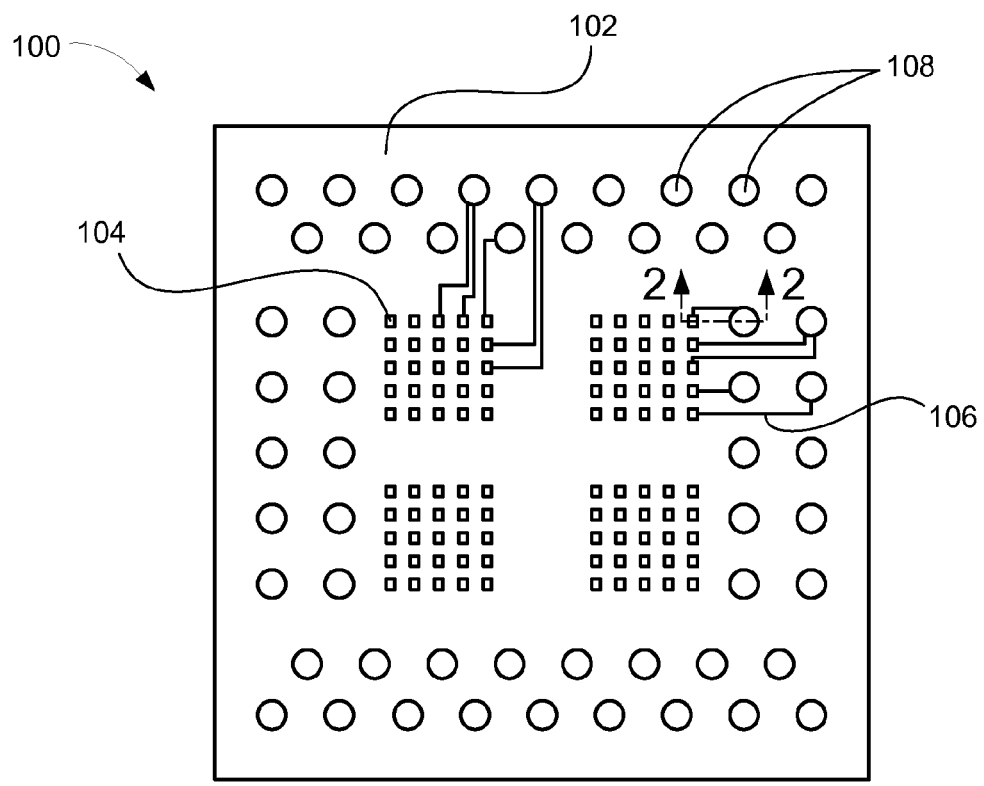
FIG. 1 is a top view of an integrated circuit system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit system 100 in an embodiment of the present invention. The integrated circuit system 100 is shown having a shield layer 102 surrounding metal pads 104. The shield layer 102 may be a thermosetting polyimide or other insulating and shock absorbing layer. The metal pads 104 are exposed from the shield layer 102 by forming holes in the shield layer 102.

Routing traces 106 such as aluminum traces are formed on the surface of the shield layer 102. A "routing trace" is defined as a conductive element that may be used to rout signals between elements. The routing traces 106 extend substantially beyond the edges of the metal pads 104 to create a routing trace that is substantially larger than the metal pads 104. The bumps 108 are manufactured atop the routing traces 106, and are arranged to interface with connections on an outside package or device (not shown).

The metal pads 104 are shown arranged in four matrices. The arrangement of the metal pads 104 may be regular or irregular depending on the arrangement of the bumps 108 and the underlying circuitry (not shown). Further the routing traces 106 may connect multiple metal pads 104 to a single bump 108 or may connect one metal pad 104 to multiple bumps 108.

Figure 2:
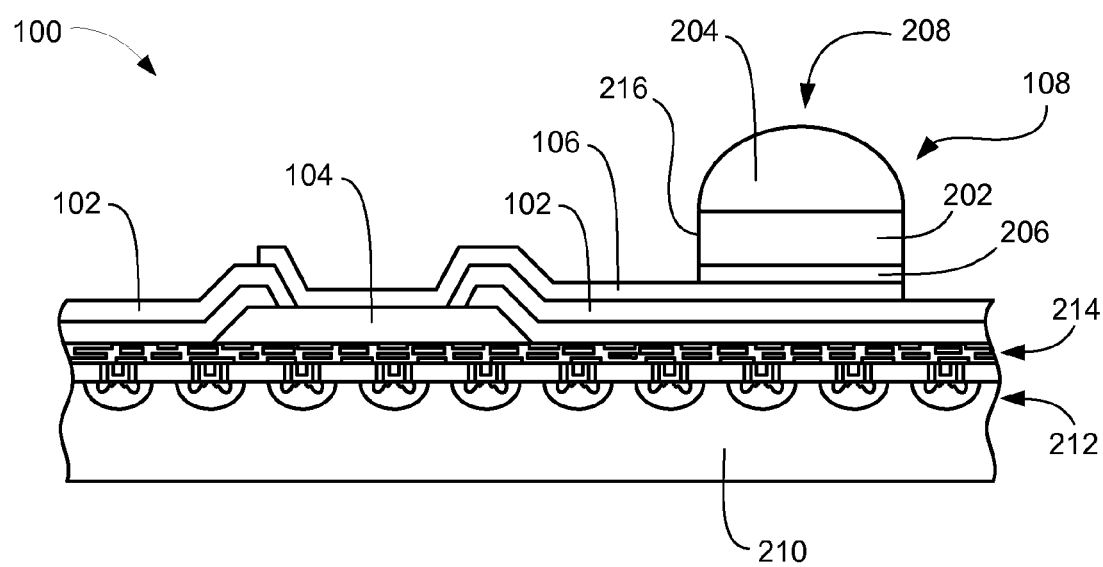
FIG. 2 is a cross-sectional view of the integrated circuit system along the line 2-2 of FIG. 1.

Referring now to FIG. 2, therein is shown a cross-sectional view of the integrated circuit system 100 along the line 2-2 of FIG. 1. The integrated circuit system 100 is shown having the bump 108 formed atop the routing trace 106. The bump 108 is shown having a pedestal portion 202, a solder portion 204, and an under bump metallization portion 206. The under bump metallization portion 206 is generally formed in many layers from metal compositions such as copper, chromium, nickel, titanium, vanadium, and other metals depending on the desired bump material and characteristics.

The pedestal portion 202 may also be made of various metals such as copper. The solder portion 204 is made of tin and lead. The solder portion 204 is shown having a domed surface 208 formed in a reflow process step. The routing trace 106 is shown connecting the bump 108 to the metal pad 104. The routing trace 106 is in direct contact with the metal pad 104 and is shown atop the shield layer 102. The routing trace 106 is shown fully covering the metal pad 104 that is not covered by the shield layer 102. The routing trace 106 is further shown extending onto portions of the shield layer 102 that cover sides of the bump 108.

The metal pad 104 is formed above a substrate 210 such as a silicone substrate. The Substrate 210 is shown having transistor elements 212 and metallization layers 214. The transistor elements 212 can be on a side of the metallization layers 214 facing away from the metal pad 104. It has been discovered that the present invention has many benefits. First, since the bump 108 is formed on the routing trace 106 not on the metal pad 104, the shield layer 102 is under the entire area of the bump 108 and can be used to protect the substrate 210 from mechanical forces that would be transferred through the bump 108.

Offsetting the bump 108 in this way keeps the mechanical forces from being transferred from the bump 108 through the metal pad 104 directly to the substrate 210. It is increasingly important to protect the substrate 210 from external forces as the transistor elements 212 and the metallization layers 214 become smaller and more sensitive to shock. Specifically, as the transistor elements 212 and the metallization layers 214 become smaller brittle low-k (low-kappa) dielectrics such as fluorine or carbon doped silicon dioxide are used to combat charge buildup and cross talk in very thin insulating layers. Utilizing low-k dielectrics reduces parasitic capacitance but protecting these sensitive elements becomes vitally important and is accomplished by offsetting the bump 108 from the metal pad 104 utilizing the routing trace 106.

Second, it has been discovered that substantial production gains may be realized by offsetting the location of the bump 108 from the metal pad 104. This inventive design facilitates the "probe before bump model" of testing the integrated circuit system 100 before the bumps 108 are formed. This testing allows significant improvements by facilitating partitioning the logistics of manufacture between foundries and bumping service providers.

Third, an unexpected benefit of the present invention is that the size of the bump 108 is not tied to the size of the metal pad 104. As the size of the metal pads 104 shrink with the shrinking size of the transistor elements 212 and the metallization layers 214 the bump 108 is designed with the need to interface with external components or connections (not shown). Thus, it has been discovered that the bumps 108 may be formed in any size that facilitates a proper external connection while the metal pads 104 may continue to decrease in size without having adverse effects on the size of the bumps 108.

Finally, an unexpected production improvement was discovered by eliminating a second polymer layer (not shown) above the routing traces 106. By creating the pedestal portion 202 of the bump 108 having a side wall 216 that is non-wettable to the solder portion 204, the need for a polymer layer protecting the routing traces 106 is eliminated. This reduces the cost of goods sold. The side wall 216 of the pedestal portion 202 may be made non-wettable by oxidation.

Figure 3A:
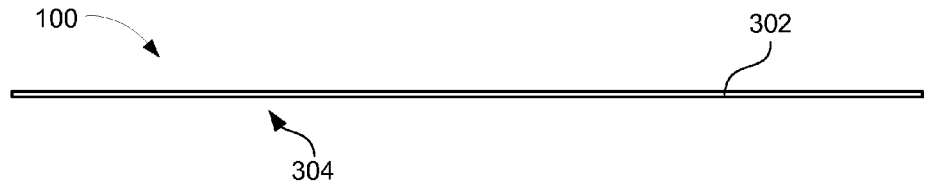
FIG. 3A is an integrated circuit system of FIG. 2 in a wafer providing phase of manufacture.

Referring now to FIG. 3A is an integrated circuit system 100 of FIG. 2 in a wafer providing phase of manufacture. The integrated circuit system 100 is shown having the substrate 210 of FIG. 2 provided as part of a wafer 302.

Figure 3B:
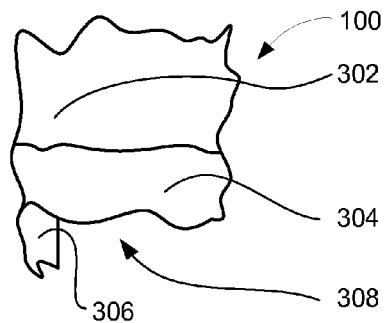
FIG. 3B is a magnified region of the integrated circuit system of FIG. 3A.
Figure 3C:
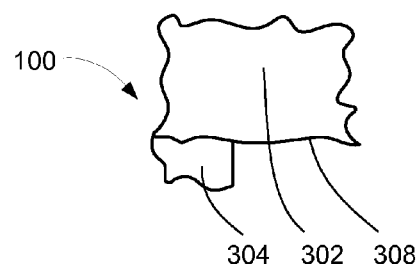
FIG. 3C is an integrated circuit system of FIG. 3B after a deep subcollector implant barrier etch phase of manufacture.
Figure 3D:
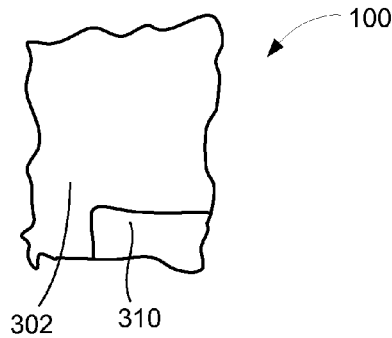
FIG. 3D is the integrated circuit system of FIG. 3B after a deep subcollector implant phase of manufacture.
Figure 3E:
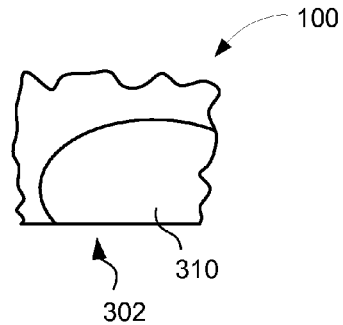
FIG. 3E is the integrated circuit system of FIG. 3B after a high temperature anneal phase of manufacture.
Figure 3F:
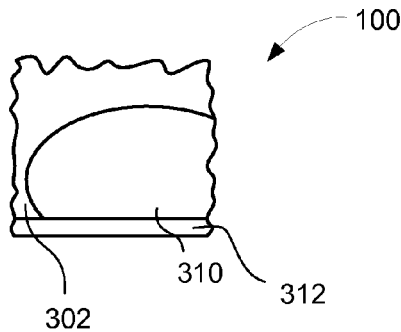
FIG. 3F is the integrated circuit system of FIG. 3B after an implant barrier growth phase of manufacture.
Figure 3G:
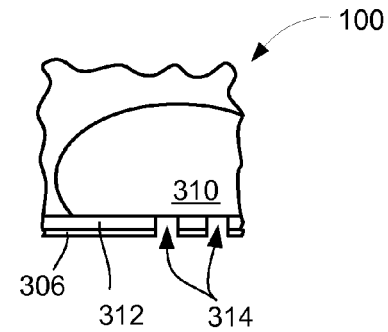
FIG. 3G is the integrated circuit system of FIG. 3B after an implant barrier etch phase of manufacture.
Figure 3H:
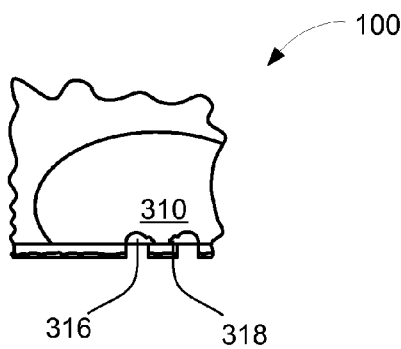
FIG. 3H is the integrated circuit system of FIG. 3B after an implant phase of manufacture.
Figure 3I:
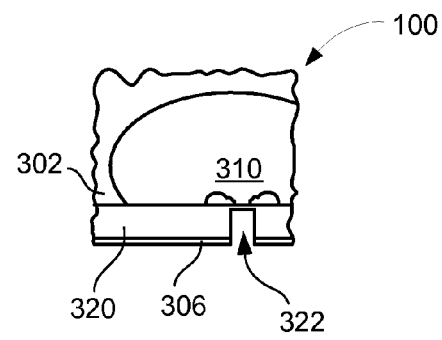
FIG. 3I is the integrated circuit system of FIG. 3B after a gate dielectric etch phase of manufacture.
Figure 3J:
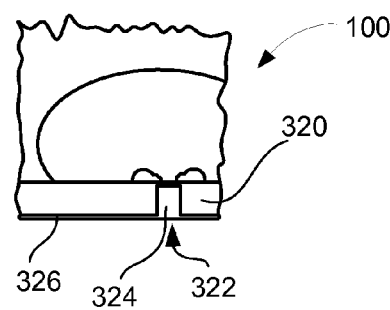
FIG. 3J is the integrated circuit system of FIG. 3B after a gate deposition phase of manufacture.
Figure 3K:
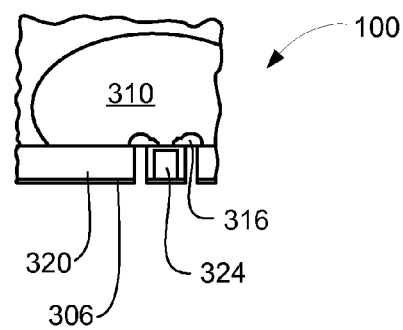
FIG. 3K is the integrated circuit system of FIG. 3B after a source and drain trench forming phase of manufacture.
Figure 3L:
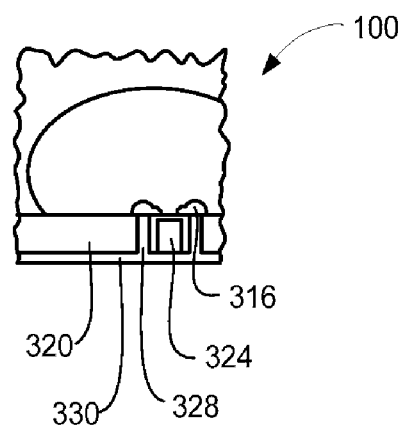
FIG. 3L is the integrated circuit system of FIG. 3B after a source and drain deposition phase of manufacture.
Figure 3M:
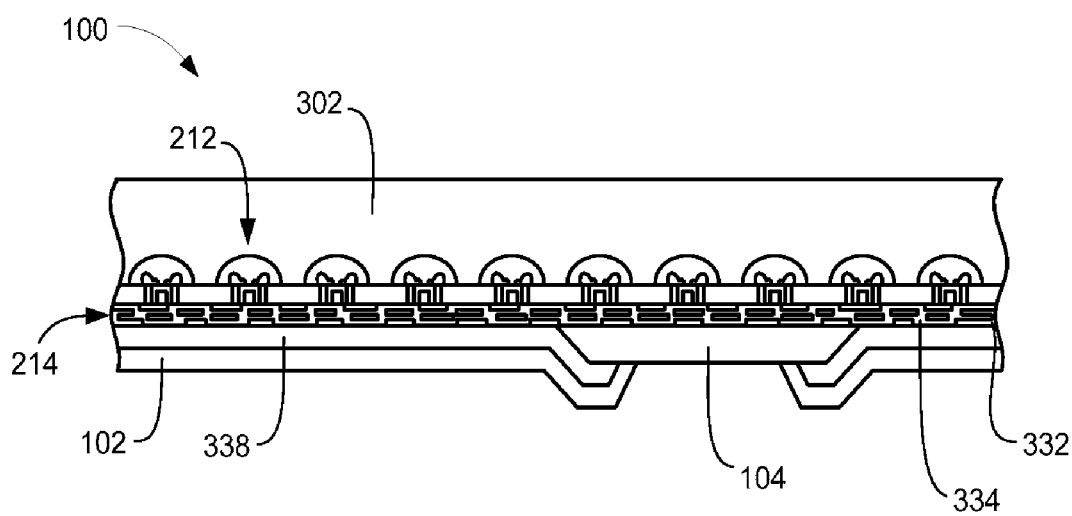
FIG. 3M is the integrated circuit system of FIG. 3B after a polymer processing phase of manufacture.
Figure 3N:
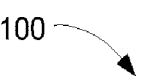
FIG. 3N is the integrated circuit system of FIG. 3B after a routing layer etch phase of manufacture.
Figure 3O:
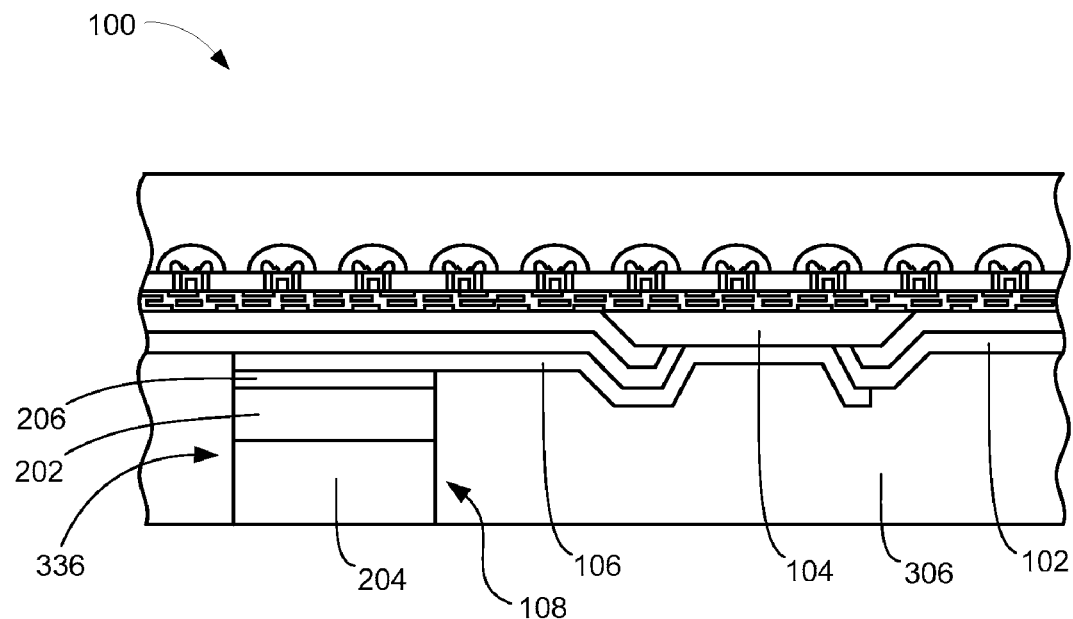
FIG. 3O is the integrated circuit system of FIG. 3B after a metal deposition phase of manufacture.
Figure 3P:
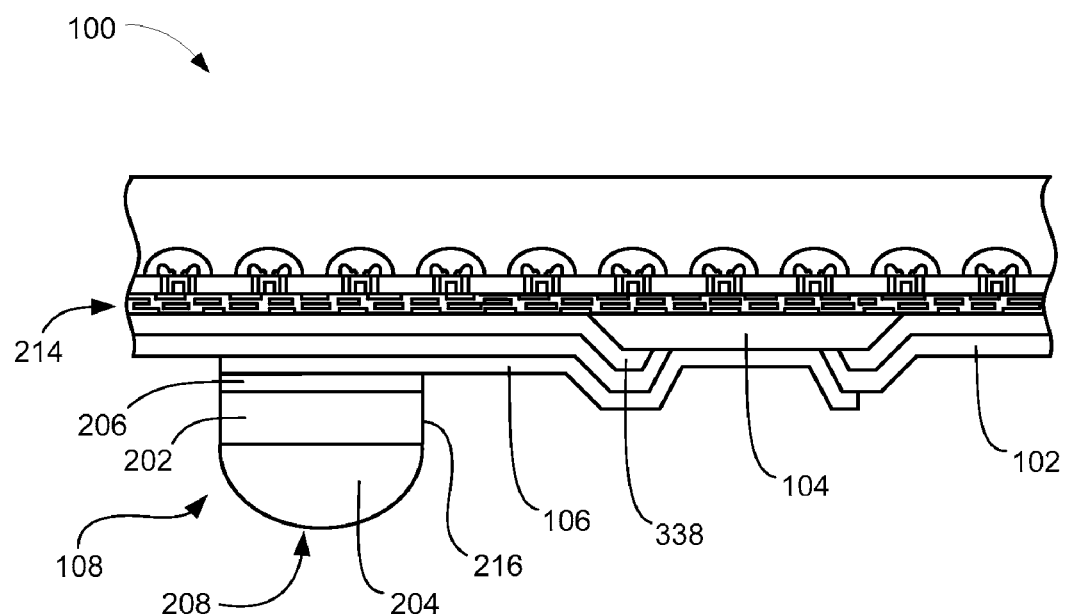
FIG. 3P is the integrated circuit system of FIG. 3B after a reflow phase of manufacture.

FIGS. 3B-3P depict a highly simplified process overview for forming the transistor elements 212 of FIG. 2 such as PMOS MOSFET for CMOS transistor logic on the wafer 302. It must be noted that many components may be formed on the wafer 302 such as memory, logic, analog devices, or none of these depending on the application of the integrated circuit system 100.

Referring now to FIG. 3B, therein is shown a magnified region 304 of the integrated circuit system 100 of FIG. 3A. The integrated circuit system 100 is shown having the wafer 302 such as a silicon wafer having a deep subcollector implant barrier 304 deposited thereon and having a film of exposed photoresist 306 deposited on the deep subcollector implant barrier 304.

The photoresist 306 is shown having vias 308, which will expose portions of the deep subcollector implant barrier 304 to an etch process.

Referring now to FIG. 3C is an integrated circuit system 100 of FIG. 3B after a deep subcollector implant barrier etch phase of manufacture. The integrated circuit system 100 is shown having the deep subcollector implant barrier 304 etched exposing a portion 308 of the wafer 302.

Referring now to FIG. 3D, therein is shown the integrated circuit system 100 of FIG. 3B after a deep subcollector implant phase of manufacture. The wafer 302 is shown having a deep subcollector well 310 implanted in the wafer 302 and the deep subcollector implant barrier 304 of FIG. 3C has been removed.

Referring now to FIG. 3E, therein is shown the integrated circuit system 100 of FIG. 3B after a high temperature anneal phase of manufacture. The integrated circuit system 100 is shown having the deep subcollector well 310 dispersed deeper into the wafer 302 through the high temperature annealing process.

Referring now to FIG. 3F, therein is shown the integrated circuit system 100 of FIG. 3B after an implant barrier growth phase of manufacture. The integrated circuit system 100 is shown having an implant barrier 312 such as silicon-nitride deposited covering the wafer 302 and the deep subcollector well 310.

Referring now to FIG. 3G, therein is shown the integrated circuit system 100 of FIG. 3B after an implant barrier etch phase of manufacture.

The integrated circuit system 100 is shown having the photo resist 306 deposited on an implant barrier 312. The implant barrier 312 has been etched to reveal portions 314 of the deep subcollector wells 310 that will become transistor wells.

Referring now to FIG. 3H, therein is shown the integrated circuit system 100 of FIG. 3B after an implant phase of manufacture. The integrated circuit system 100 is shown having transistor wells 316 implanted into the deep subcollector wells 310. The transistor wells 316 are shown having extensions 318. The extensions are low doping regions of source and drain toward channel and prevents premature breakdown of drain-substrate junction.

Referring now to FIG. 3I, therein is shown the integrated circuit system 100 of FIG. 3B after a gate dielectric etch phase of manufacture. The integrated circuit system 100 is shown having the implant barrier 312 of FIG. 3G removed. A gate dielectric 320, such as silicon dioxide (SiO2) or a low-k dielectric such as fluorine or carbon doped silicon dioxide, is deposited covering the deep subcollector wells 310, the wafer 302. The photo resist 306 has been deposited on the gate dielectric 320. The gate dielectric 320 is etched to form a gate trench 322.

Referring now to FIG. 3J, therein is shown the integrated circuit system 100 of FIG. 3B after a gate deposition phase of manufacture. The integrated circuit system 100 is shown having the photo resist 306 of FIG. 3I stripped and a gate 324 deposited in the gate trench 322. The gate 324 may be formed by metal deposition and may consist of stacked Ti-nitride (TiN), Ti-Aluminum (TiAl), Tantalum (Ta), and Ti-nitride (TiN). A gate metal layer 326 is also shown covering the gate dielectric 320.

Referring now to FIG. 3K, therein is shown the integrated circuit system 100 of FIG. 3B after a source and drain trench forming phase of manufacture. The integrated circuit system 100 is shown having the gate metal layer 326 of FIG. 3J etched back to expose the gate dielectric 320. The photo resist 306 is deposited covering the gate dielectric 320 and the gate 324. The gate dielectric 320 is etched below the transistor wells 316 to expose the deep subcollector wells 310 from the gate dielectric 320.

Referring now to FIG. 3L, therein is shown the integrated circuit system 100 of FIG. 3B after a source and drain deposition phase of manufacture. The integrated circuit system 100 is shown having source and drain plugs 328 such as Tungsten (W) source and drain plugs deposited on the transistor wells 316 exposed from the gate dielectric 320. A source and drain residual layer 330 covers the gate 324, and the gate dielectric 320.

Referring now to FIG. 3M, therein is shown the integrated circuit system 100 of FIG. 3B after a polymer processing phase of manufacture. The integrated circuit system 100 is shown having the transistor elements 212 formed in the wafer 302 and having the metallization layers 214 deposited below the transistor elements 212. The metallization layers 214 are formed having metallization layer traces 332 embedded in a metallization layer insulator 334. Formed below the metallization layers 214 is the metal pad 104. The metal pad 104 is connected to the metallization layer traces 332, which will electrically connect the metal pad 104 to the transistor elements 212. The metal pad 104 is also in contact with the metallization layer insulator 334.

Covering a portion of the metal pad 104 and the metallization layers 214 is a passivation layer 338 such as silicon nitride (SiN). The passivation layer 338 acts as a high tensile strength resistive layer between the metallization layers 214 and the shield layer 102. Covering the passivation layer 338 and a portion of the metal pad 104 is the shield layer 102 on a side of the passivation layer 338 opposite the metallization layers 214. The shield layer 102 has been processed to expose a portion of the metal pad 104 while creating a protective barrier against shock for the transistor elements 212.

Referring now to FIG. 3N, therein is shown the integrated circuit system 100 of FIG. 3B after a routing layer etch phase of manufacture. The integrated circuit system 100 is shown having the routing trace 106 formed directly on the shield layer 102 and connected to the metal pad 104. The routing trace 106, the passivation layer 338 of FIG. 3M, and the shield layer 102 are in direct contact with a side of the metal pad facing away from the substrate 210 of FIG. 2.

Referring now to FIG. 3O, therein is shown the integrated circuit system 100 of FIG. 3B after a metal deposition phase of manufacture. The integrated circuit system 100 is shown having the photo resist 306 formed as a layer below the shield layer 102 and having a via 336. The via 336 is shown filled by the pedestal portion 202 and the solder portion 204 of the bump 108.

Referring now to FIG. 3P, therein is shown the integrated circuit system 100 of FIG. 3B after a reflow phase of manufacture. The integrated circuit system 100 is shown having the photo resist 306 of FIG. 3O removed to expose the bump 108. The bump 108 has been processed to ensure that the side wall 216 is not wettable to solder during reflow. The solder portion 204 of the bump 108 is shown having the domed surface 208 created by a reflow process.

Between the shield layer 102 and the metallization layers 214, and over edges of the metal pad 104 is formed the passivation layer 338 such as silicon nitride (SiN), which provides a high tensile strength protection of the underlying transistor elements 212. The passivation layer 338 surrounds the edges of the metal pads 104.

Figure 4:
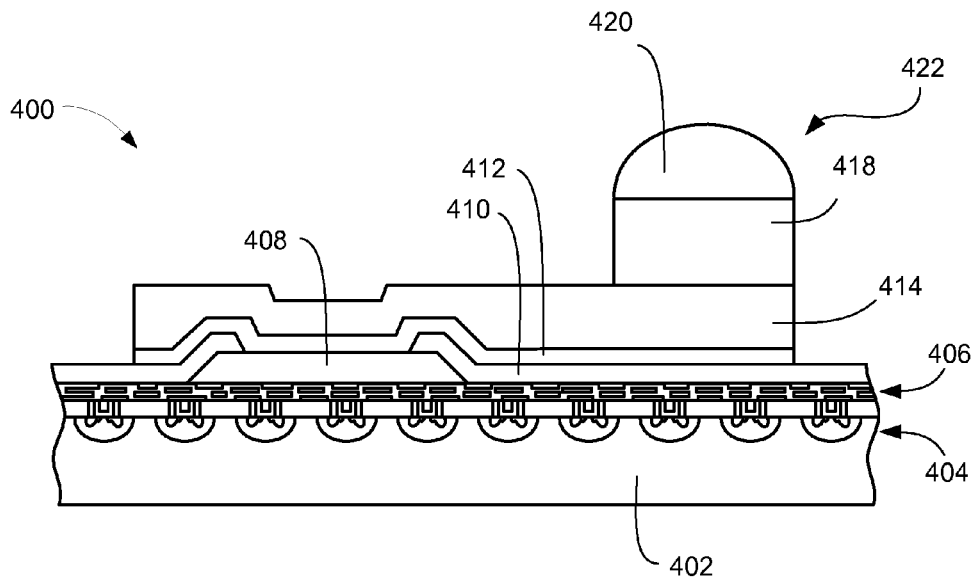
FIG. 4 is a cross-sectional view of an integrated circuit packaging system in a further embodiment of the present invention.

Referring now to FIG. 4, therein is shown a cross-sectional view of the integrated circuit system 400 in a further embodiment of the present invention. The integrated circuit system 400 is shown having a substrate 402 such as a silicone substrate. The substrate 402 is shown having transistor elements 404 and metallization layers 406. A metal pad 408 is formed above the substrate 402. Over edges of the metal pad 408 is formed a passivation layer 410 such as silicon nitride (SiN), which provides a high tensile strength protection of the underlying transistor elements 404. The passivation layer 410 surrounds the edges of the metal pads 408.

Routing traces 412 such as aluminum or copper traces are formed on the surface of the passivation layer 410. The routing traces 412 extend substantially beyond the edges of the metal pads 408. This creates the routing trace 412 that is substantially larger than the metal pad 408. The routing traces 412 can conform to a shape of the metal pads 408 on the substrate 402.

Formed above the routing traces 412 is a rigid layer 414 typically made from copper, nickel, gold, titanium, or combinations thereof. The rigid layer is thicker than the metal pad 408, the passivation layer 410, and the routing traces 412. The thickness of the rigid layer 414 lowers stress at metallization layers 406 and transistor elements 404.

A top the rigid layer 414 are bumps 416 having a pedestal portion 418 and a solder portion 420. A rigid layer is defined herein as a conductive layer of reasonable rigidity to substantially distribute the coefficient of thermal expansion between the bump 416 and the package substrate 402. The optimum thickness of the rigid layer 414 can be calculated using finite element analysis.

Stresses are believed to concentrate and transmit through the opening of the passivation layer 410 into the substrate 402 where the passivation layer 410 covers only the perimeter of the metal pad 408. It has been discovered that the use of the rigid layer 414 distributes the forces involved in production and use of the integrated circuit system 400. Thus the present invention alleviates the magnitude of stresses transmitted to the substrate 402 and improves the reliability of the device while increasing end-line yield.

It has been further discovered that the use of the rigid layer 414 reduces process steps and time by eliminating the need for a polyimide layer because stresses are reduced without resorting to a polyimide structure. This obviates a polyimide process thereby reducing the process complexity, cost and cycle time, while the rigid layer 414 can be achieved with the same basic plated bumping process without additional steps.

It has been still further discovered In addition, the rigid layer 414 can conceivably also be used as a means to distribute current thereby alleviating the problem of Electromigration. It has lastly been discovered that the rigid layer 414 allows bump geometry to be de-coupled from constraints arising from underlying metal pad 408 geometry and position.

The pedestal portion 418 may also be made of various metals such as copper. The solder portion 420 is made of tin and lead. The solder portion 420 is shown having a domed surface 422 formed in a reflow process step. The routing trace 412 and the rigid layer 414 are shown connecting the bump 416 to the metal pad 408.

The routing trace 412 is in direct contact with the metal pad 408. The routing trace 412 is shown fully covering the metal pad 408 that is not covered by the passivation layer 410. The routing trace 412 is further shown extending onto portions of the passivation layer 410 that cover sides of the bump 416. The rigid layer 414 does not electrically insulate the routing traces 412 and the rigid layer 414 is not itself electrically isolated by a subsequent layer.

Figure 5:
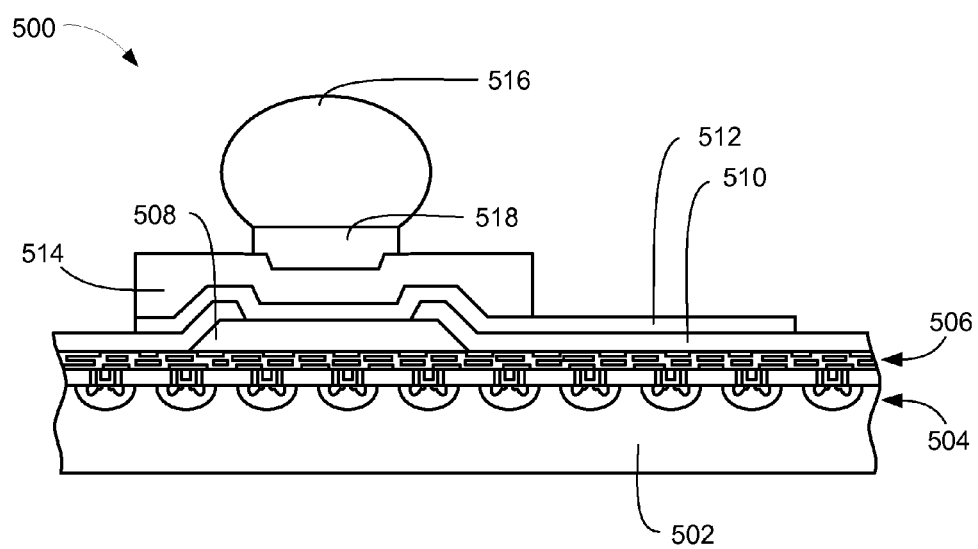
FIG. 5 is a cross-sectional view of an integrated circuit packaging system in a further embodiment of the present invention.

Referring now to FIG. 5, therein is shown a cross-sectional view of the integrated circuit system 500 in a further embodiment of the present invention. The integrated circuit system 500 is shown having a substrate 502 such as a silicone substrate. The substrate 502 is shown having transistor elements 504 and metallization layers 506. A metal pad 508 is formed above the substrate 502. Over edges of the metal pad 508 is formed a passivation layer 510 such as silicon nitride (SiN), which provides a high tensile strength protection of the underlying transistor elements 504. The passivation layer 510 surrounds the edges of the metal pads 508.

Routing traces 512 such as aluminum or copper traces are formed on the surface of the passivation layer 510. The routing traces 512 extend substantially beyond the edges of the metal pads 508. This creates the routing trace 512 that is substantially larger than the metal pad 508.

Formed above the routing traces 512 is a rigid layer 514 typically made from copper, nickel, gold, titanium, or combinations thereof. Atop the rigid layer 514 are bumps such as solder balls 516 having a pedestal portion 518. Stresses are believed to concentrate and transmit through the opening of the passivation layer 510 into the substrate 502 where the passivation layer 510 covers only the perimeter of the metal pad 508.

It has been discovered that the use of the rigid layer 514 distributes the forces involved in production and use of the integrated circuit system 500 so that the solder balls 516 may be deposited directly over the metal pads 508 without creating prohibitive stresses. Thus the present invention alleviates the magnitude of stresses transmitted to the substrate 502 and improves the reliability of the device while increasing end-line yield.

The routing trace 512 is in direct contact with the metal pad 508. The routing trace 512 is shown fully covering the metal pad 508 that is not covered by the passivation layer 510. The routing trace 512 is further shown extending onto portions of the passivation layer 510 that cover sides of the bump 516. The rigid layer 514 does not electrically insulate the routing traces 512 and the rigid layer 514 is not itself electrically isolated by a subsequent layer.

Figure 6:
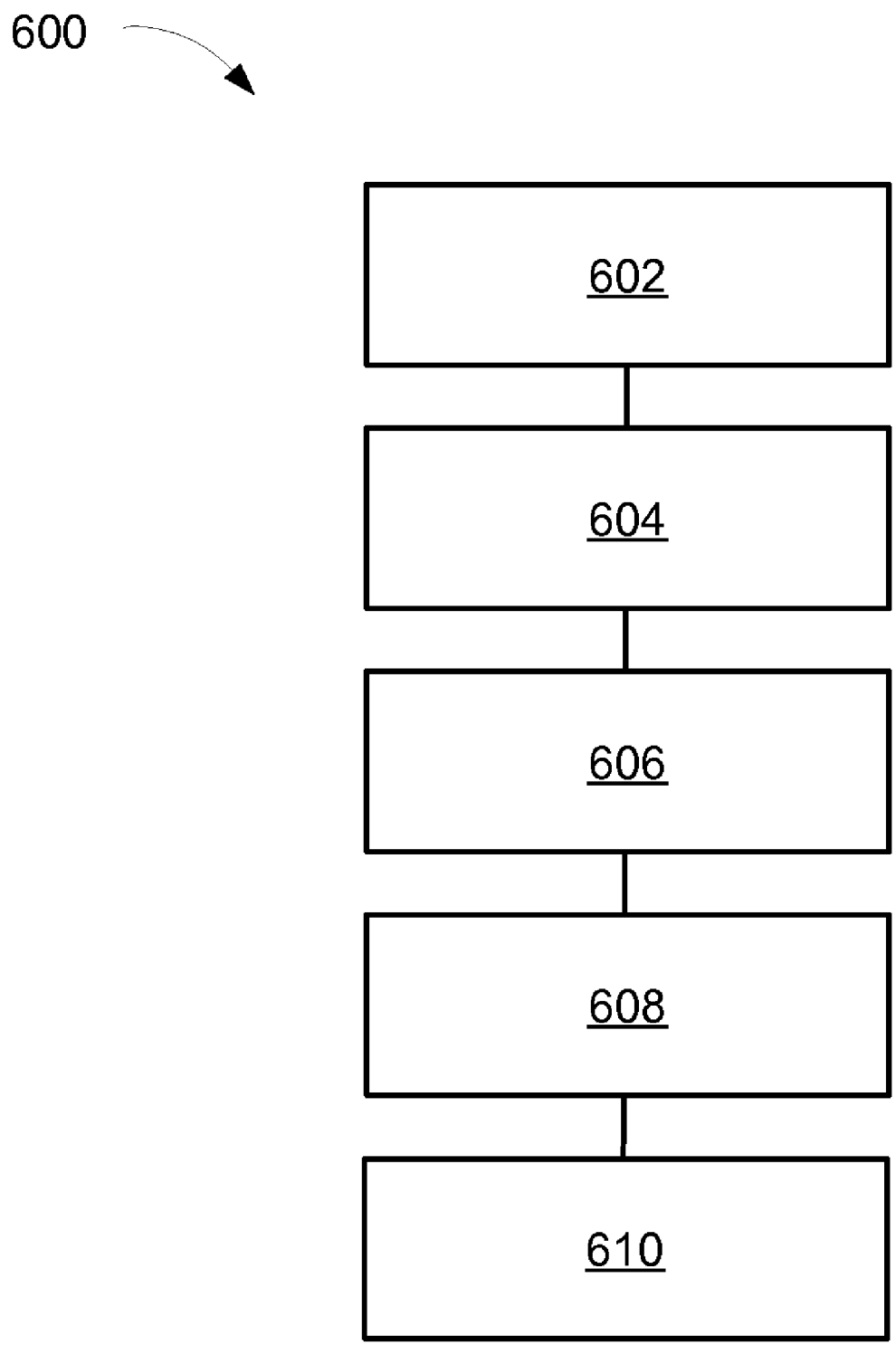
FIG. 6 is a flow chart of a method of manufacture of an integrated circuit system of FIG. 1 in a further embodiment of the present invention.

Referring now to FIG. 6, therein is shown a flow chart of a method 600 of manufacture of an integrated circuit system 100 of FIG. 1 in a further embodiment of the present invention. The method 600 includes providing a substrate having a transistor and a metallization layer in a block 602; forming a metal pad in direct contact with the metallization layer of the substrate in a block 604; forming a passivation layer in direct contact with the metal pad and covering the substrate in a block 606; forming a routing trace above the passivation layer in direct contact with the metal pad, and the routing trace is substantially larger than the metal pad, and the routing trace is not electrically insulated by a subsequent layer in a block 608; and forming a bump connected to the metal pad with the routing trace in a block 610.

Thus, it has been discovered that the offset bump with a partial redistribution layer system of the present invention furnishes important and heretofore unknown and unavailable solutions, capabilities, and functional aspects for integrated circuit system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit system comprising:
   providing a substrate having a transistor and a metallization layer;
   forming a metal pad in direct contact with the metallization layer of the substrate;
   forming a passivation layer in direct contact with the metal pad and covering the substrate;
   forming a shield layer on the passivation layer;
   forming a routing trace above the passivation layer and on the shield layer, the routing trace, the passivation layer, and the shield layer in direct contact with a side of the metal pad facing away from the substrate with the routing trace not electrically insulated by a subsequent layer; and
   forming a bump connected to the metal pad with the routing trace.

2. The method as claimed in claim 1 further comprising:
   forming a rigid layer thicker than the metal pad between the bump and the passivation layer.

3. The method as claimed in claim 1 wherein:
   forming the shield layer includes forming the shield layer on a side of the passivation layer opposite the substrate; and
   forming the bump includes forming the bump offset from the metal pad.

4. The method as claimed in claim 1 wherein:
   providing the substrate having the transistor includes the transistor on a side of the metallization layer facing away from the metal pad.

5. The method as claimed in claim 1 wherein:
   forming the routing trace includes forming the routing trace extended onto portions of the passivation layer over portions of the metal pad.

6. A method of manufacturing an integrated circuit system comprising:
   providing a substrate having a transistor and a metallization layer;
   forming a metal pad in direct contact with the metallization layer of the substrate;
   forming a passivation layer in direct contact with the metal pad and covering the substrate;
   processing the passivation layer to expose the metal pad;
   forming a shield layer on the passivation layer;
   forming a routing trace above the passivation layer and on the shield layer, the routing trace, the passivation layer, and the shield layer in direct contact with a side of the metal pad facing away from the substrate with the routing trace not electrically insulated by a subsequent layer; and
   forming a bump having a pedestal portion and a solder portion and the bump is in direct contact with the routing trace.

7. The method as claimed in claim 6 wherein:
   forming the bump includes forming the pedestal portion oxidized and is non-wettable to the solder portion.

8. The method as claimed in claim 6 wherein:
   forming the bump includes forming the bump having an under bump metallization portion in direct contact with the routing trace.

9. The method as claimed in claim 6 wherein:
   forming the bump includes forming the bump with different horizontal dimensions, different placement above the substrate, or a combination there of, than the metal pad.

10. The method as claimed in claim 6 wherein:
    forming the bump includes forming the bump not directly over the metal pad.

11. An integrated circuit system comprising:
    a substrate having a transistor and a metallization layer;
    a metal pad in direct contact with the metallization layer of the substrate;
    a passivation layer in direct contact with the metal pad and covering the substrate;
    a shield layer on the passivation layer;
    a routing trace above the passivation layer and on the shield layer, the routing trace, the passivation layer, and the shield layer in direct contact with a side of the metal pad facing away from the substrate with the routing trace not electrically insulated by a subsequent layer; and a bump connected to the metal pad with the routing trace.

12. The system as claimed in claim 11 further comprising:
a rigid layer thicker than the metal pad between the bump and the passivation layer.

13. The system as claimed in claim 11 wherein:
the shield layer is between the passivation layer and the routing trace; and
the bump is offset from the metal pad.

14. The system as claimed in claim 11 wherein:
the transistor is on a side of the metallization layer facing away from the metal pad.

15. The system as claimed in claim 11 wherein:
the routing trace extends onto portions of the passivation layer over portions of the metal pad.

16. The system as claimed in claim 11 wherein:
the bump has a pedestal portion and a solder portion; and
the passivation layer has the characteristics of being processed to expose the metal pad.

17. The system as claimed in claim 16 wherein:
the pedestal portion of the bump is oxidized and is non-wettable to the solder portion.

18. The system as claimed in claim 16 wherein:
the bump has an under bump metallization portion in direct contact with the routing trace.

19. The system as claimed in claim 16 wherein:
the bump has different horizontal dimensions, different placement above the substrate, or a combination thereof, than the metal pad.

20. The system as claimed in claim 16 wherein:
the bump is not directly over the metal pad.

* * * * *